United States Patent
Park et al.

(10) Patent No.: US 7,772,061 B2
(45) Date of Patent: Aug. 10, 2010

(54) METHOD FOR FABRICATING SEMICONDUCTOR DEVICE USING TWO CRYSTALLIZATION METHODS

(75) Inventors: Byoung-Keon Park, Incheon (KR); Jin-Wook Seo, Suwon-si (KR); Tae-Hoon Yang, Seongnam-si (KR); Ki-Yong Lee, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 12/185,229

(22) Filed: Aug. 4, 2008

(65) Prior Publication Data
US 2008/0286912 A1    Nov. 20, 2008

Related U.S. Application Data

(62) Division of application No. 11/149,236, filed on Jun. 10, 2005, now Pat. No. 7,423,309.

(30) Foreign Application Priority Data

Jun. 30, 2004    (KR) .................. 10-2004-0050916

(51) Int. Cl.
*H01L 21/8238* (2006.01)
(52) U.S. Cl. .................. 438/210; 438/251; 438/486; 257/E21.413
(58) Field of Classification Search .............. 438/197, 438/210, 230, 250, 251, 486; 257/E21.411, 257/E21.412, E21.413
See application file for complete search history.

(56) References Cited

U.S. PATENT DOCUMENTS

| | | | |
|---|---|---|---|
| 6,093,937 A | 7/2000 | Yamazaki et al. | |
| 6,278,130 B1 * | 8/2001 | Joo et al. | 257/59 |
| 6,548,331 B2 * | 4/2003 | Lee et al. | 438/149 |
| 6,596,573 B2 * | 7/2003 | Lee et al. | 438/166 |
| 6,833,561 B2 * | 12/2004 | Joo et al. | 257/75 |
| 6,864,130 B2 | 3/2005 | Koo et al. | |
| 6,924,179 B2 | 8/2005 | Oh et al. | |
| 7,180,236 B2 | 2/2007 | Koo et al. | |
| 2003/0094613 A1 | 5/2003 | Joo | |
| 2003/0102478 A1 * | 6/2003 | Joo et al. | 257/72 |
| 2004/0084678 A1 | 5/2004 | Peng et al. | |
| 2004/0262608 A1 | 12/2004 | Kim et al. | |

FOREIGN PATENT DOCUMENTS

| | | |
|---|---|---|
| JP | 2001-244475 | 9/2001 |
| JP | 2002-208599 | 7/2002 |
| JP | 2002-299348 | 10/2002 |
| JP | 2003-297750 | 10/2003 |
| KR | 1998-077750 | 11/1998 |
| KR | 10-2003-0037113 | 5/2003 |

* cited by examiner

*Primary Examiner*—Tuan N. Quach
(74) *Attorney, Agent, or Firm*—H.C. Park & Associates, PLC

(57) ABSTRACT

A semiconductor device in which a semiconductor layer of a thin film transistor and a first electrode of a capacitor are formed of amorphous silicon and the whole or a part of source/drain regions of the semiconductor layer and the first electrode of the capacitor are crystallized by a metal induced crystallization method, and a channel region of the semiconductor layer is crystallized by a metal induced lateral crystallization method.

9 Claims, 7 Drawing Sheets 12  19  13a  16     19        15  18   14a  17  11

METHOD FOR FABRICATING SEMICONDUCTOR DEVICE USING TWO CRYSTALLIZATION METHODS

CROSS REFERENCE TO RELATED APPLICATIONS

This application is a divisional application of U.S. patent application Ser. No. 11/149,236, filed on Jun. 10, 2005, now U.S. Pat. No. 7,423,309 which claims priority to and the benefit of Korean Patent Application No. 10-2004-0050916, filed on Jun. 30, 2004, which are hereby incorporated by reference for all purposes as if fully set forth herein.

BACKGROUND OF THE INVENTION

1. Field of the Invention

The present invention relates to a semiconductor device and a method for fabricating the same. More particularly, it relates to a semiconductor device in which a thin film transistor is formed using a metal induced crystallization (MIC) method and a metal induced lateral crystallization (MILC) method and a capacitor is formed using the MIC method.

2. Discussion of the Background

Flat panel display devices such as liquid crystal display devices, organic electro-luminescence display devices and plasma display panels have drawn recent attention as replacement displays for the larger and heavier cathode ray tube.

In a flat panel display device such as the organic electro-luminescence display device and the liquid crystal display device, a thin film transistor may be used as a switching device and a driving device, and a capacitor may be coupled with the thin film transistor to store external signals and supply the stored signals in a following signal period.

FIG. 1A, FIG. 1B and FIG. 1C are cross-sectional views showing a conventional method for forming a thin film transistor and a capacitor.

First, FIG. 1A is a cross-sectional view for showing a process of forming a semiconductor layer of a thin film transistor and a first electrode of a capacitor on an insulating substrate. As FIG. 1A shows, a buffer layer 12 may be formed on a transparent insulating substrate 11, which may be made of plastic or glass. An amorphous silicon layer may then be formed on the buffer layer 12 and patterned to form a semiconductor layer 13 of the thin film transistor and the first electrode 14 of the capacitor.

A first insulation layer 15, which simultaneously serves as a gate insulator of the thin film transistor and an insulation layer of the capacitor, may be formed on the substrate. The first insulation layer 15 may be a silicon oxide or silicon nitride layer.

FIG. 1B is a cross-sectional view for showing a process of crystallizing the patterned amorphous silicon layer and forming a gate electrode of the thin film transistor and a second electrode of the capacitor. As FIG. 1B shows, polycrystalline silicon layers 13a, 14a may be formed by crystallizing the amorphous silicon semiconductor layer 13 and the first electrode 14. Although there are various crystallization methods, a common crystallization method includes charging the substrate into a furnace and performing crystallization at a certain temperature for a long time.

After forming the polycrystalline silicon layers 13a, 14a, a conductor may be formed on the substrate and patterned, thereby forming a gate electrode 16 of the thin film transistor and a second electrode 17 of the capacitor, thereby completing the capacitor comprising the first electrode 14a, the insulation layer 15 and a second electrode 17.

FIG. 1C is a cross-sectional view for showing a process of forming a second insulation layer on the substrate and forming source/drain electrodes on the second insulation layer. As FIG. 1C shows, a second insulation layer 18, which serves as an interlayer dielectric of the thin film transistor, may be formed on the substrate.

Contact holes that expose portions of source/drain regions of the semiconductor layer 13a may then be formed in the first insulation layer 15 and the second insulation layer 18. Next, forming source/drain electrodes 19 on the contact holes completes the thin film transistor.

Therefore, the thin film transistor's semiconductor layer, gate insulator and gate electrode may be simultaneously formed with the capacitor's first electrode, insulation layer and second electrode, respectively, and the semiconductor layer and the first electrode may be crystallized by the same crystallization method.

However, a method for forming a semiconductor device such as the thin film transistor and the capacitor may require lengthy heat treatment since the capacitor's first electrode may be much larger than the thin film transistor's channel region, and the lengthy heat treatment process may shrink or warp the substrate. Additionally, capacitance may decrease since the capacitor's insulation layer is simultaneously formed with the gate insulator, which may be thicker than necessary for the capacitor.

SUMMARY OF THE INVENTION

The present invention provides a semiconductor device in which all or a part of source/drain regions of a semiconductor layer and a first electrode of a capacitor are crystallized by the MIC method, and a channel region of the semiconductor layer is crystallized by the MILC method.

Additional features of the invention will be set forth in the description which follows, and in part will be apparent from the description, or may be learned by practice of the invention.

The present invention discloses a semiconductor device comprising a substrate, a thin film transistor on the substrate and comprising a semiconductor layer having source/drain regions with regions that are crystallized by a metal induced crystallization method and a channel region that is crystallized by metal induced lateral crystallization method. A capacitor is spaced apart from the thin film transistor and comprises a first electrode crystallized by the metal induced crystallization method.

The present invention discloses a method for fabricating semiconductor device including defining a semiconductor layer and a first electrode of a capacitor by depositing amorphous silicon on a substrate and patterning the amorphous silicon, forming a first insulation layer on the substrate, defining source/drain regions and a channel region of the semiconductor layer by implanting impurities into the semiconductor layer and implanting impurities into the first electrode of the capacitor, forming a first insulation layer pattern by etching the first insulation layer, forming a crystallization inducing material on the semiconductor layer and the first electrode of the capacitor that are exposed by the first insulation layer and a second insulation layer on the substrate, and crystallizing regions of the source/drain regions and the first electrode of the capacitor by a metal induced crystallization method and crystallizing the channel region by a metal induced lateral crystallization method by heat treating the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1A:
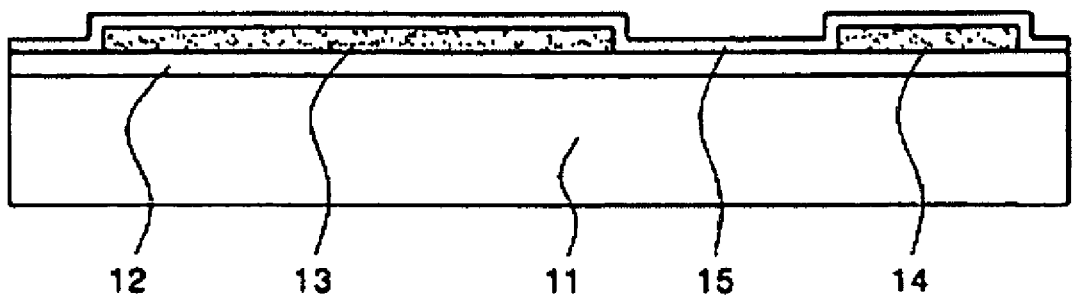
FIG. 1A, FIG. 1B and FIG. 1C are cross-sectional views of a fabrication process of thin film transistor and capacitor by the prior art.
Figure 1B:
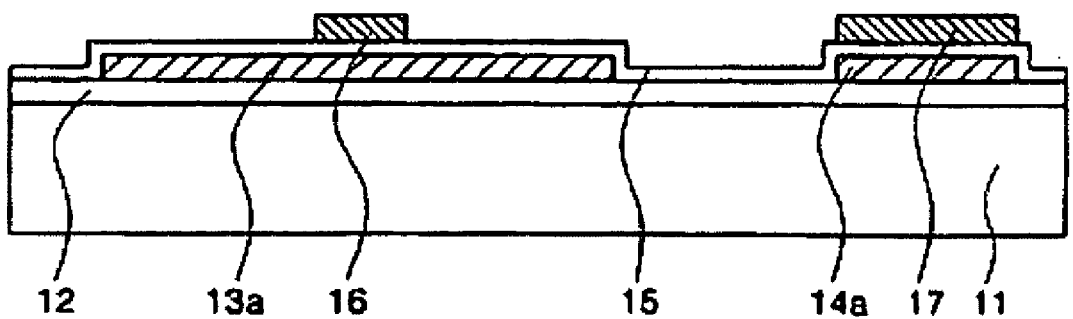
Figure 1C:
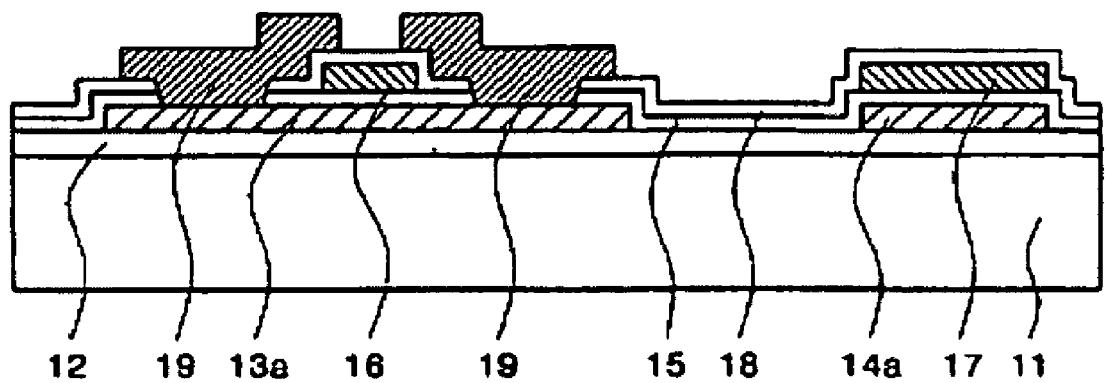

Exemplary embodiments of the present invention will now be described in detail with reference to the accompanying drawings. Like reference characters designate corresponding parts throughout several views.

FIG. 2A, FIG. 2B, FIG. 2C, FIG. 2D, FIG. 2E and FIG. 2F are cross-sectional views showing a fabrication process of a semiconductor device in which source/drain regions of a thin film transistor and a first electrode of a capacitor are crystallized by a metal induced crystallization (MIC) method, and a channel region of the thin film transistor is crystallized by a metal induced lateral crystallization (MILC) method.

Figure 2A:
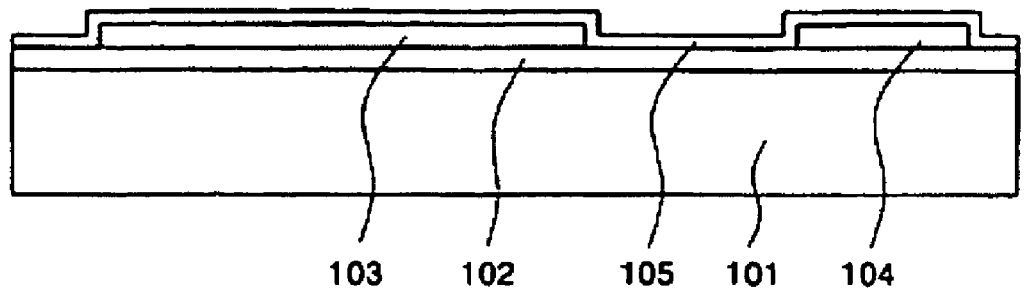
FIG. 2A, FIG. 2B, FIG. 2C, FIG. 2D, FIG. 2E and FIG. 2F are cross-sectional views showing a fabrication process of a semiconductor device according to an exemplary embodiment of the present invention.

FIG. 2A is a process cross-sectional view showing a step of defining a semiconductor layer and a first electrode of a capacitor by depositing and patterning amorphous silicon on an insulating substrate and forming a first insulation layer on the substrate. As FIG. 2A shows, a buffer layer 102, which may be an oxide layer or a nitride layer, may be formed on a transparent insulating substrate 101, which may be made of for example, plastic or glass. The buffer layer 102 may protect a device that is subsequently formed on the substrate.

Next, an amorphous silicon layer may be formed on the entire surface of the substrate by a physical vapor deposition method using sputter, or a chemical vapor deposition method using plasma enhanced chemical vapor deposition (PECVD) or low pressure chemical vapor deposition (LPCVD) equipment.

The amorphous silicon layer may then be patterned to form an amorphous silicon pattern defining a semiconductor layer 103 of a thin film transistor and a first electrode 104 of a capacitor.

After forming the amorphous silicon pattern, a first insulation layer 105, which may be formed of an oxide or nitride layer, may be formed the entire surface of the substrate.

Figure 2B:
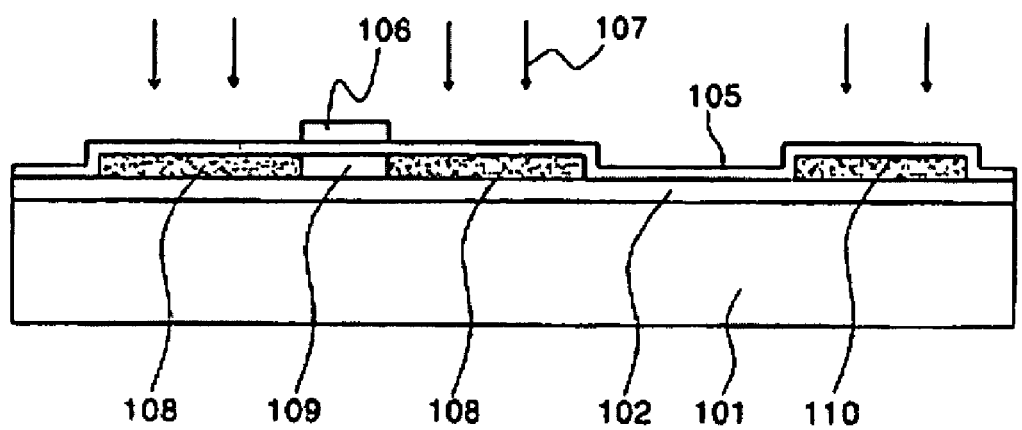

FIG. 2B is a process cross-sectional view showing a step of forming a photoresist pattern on a certain region of the semiconductor layer, defining source/drain regions and a channel region of the semiconductor layer by implanting impurities using the photoresist pattern as a mask, and implanting impurities into the first electrode of the capacitor. As FIG. 2B shows, a photoresist pattern 106 may be formed by coating a photoresist on the first insulation layer 105 by a coating method, such as spin coating, and then exposing and developing the photoresist. The photoresist pattern 106 may be formed on a central part of the semiconductor layer 103 since a region on which the photoresist pattern 106 is formed defines a channel region 109 of the thin film transistor.

Subsequently, impurities may be implanted on the surface of the substrate having the photoresist pattern 106 during impurity implantation process 107 to thereby form source/drain regions 108 and the channel region 109, as well as the first electrode 110 of the capacitor. The semiconductor layer 103 is divided into source/drain regions 108 and the channel region 109, because regions into which impurities are implanted are defined as source/drain regions 108, and a region into which impurities are not implanted is defined as the channel region 109. The impurities are also implanted into the first electrode 110 of the capacitor so that the first electrode 110 of the capacitor has conductor-like electrical properties.

Figure 2C:
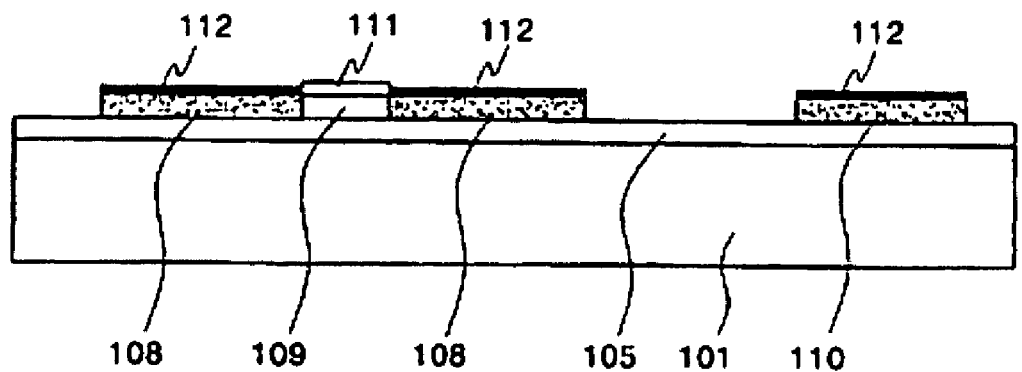

FIG. 2C is a step of forming a first insulation layer pattern by etching the first insulation layer, and forming a crystallization inducing material on the substrate. As FIG. 2C shows, the photoresist pattern 106 is removed after etching the first insulation layer 105 using the photoresist pattern 106 as a mask so that a first insulation layer pattern 111 remains on the channel region 109 only. A metal material may then be deposited on the entire surface of the substrate and heat treated to form a crystallization inducing material 112 on the surface of the source/drain regions 108 and on the surface of the first electrode 110 of the capacitor. The metal material remaining after forming the crystallization inducing material 112 is removed. The first insulation layer pattern 111 remains on the substrate to prevent the metal material from forming on the channel region 109 of the semiconductor layer.

The metal material may be one or more metals selected from Ni, Pd, Ti, Ag, Au, Al, Sn, Sb, Cu, Co, Mo, Tr, Ru, Rh, Cd and Pt, but it may be preferable to use Ni. The metal material may be deposited using sputtering equipment. Alternatives include, for example, heating evaporation equipment, ion implantation equipment and chemical vapor deposition equipment. Although deposition thickness of the metal material is not limited, the metal material may be deposited to a thickness of about 1 to 10,000 Å, preferably 10 to 200 Å.

The crystallization inducing material 112 is metal silicide, which may be formed by heat treating the metal material and silicon, thereby reacting the metal material with silicon. Particularly, a crystallization inducing material 112 formed by heat treating deposited Ni is called nickel silicide.

The heat treatment process not only forms the crystallization inducing material, but it also simultaneously activiates impurities implanted into the semiconductor layer and the first electrode by the impurity implantation process.

Figure 2D:
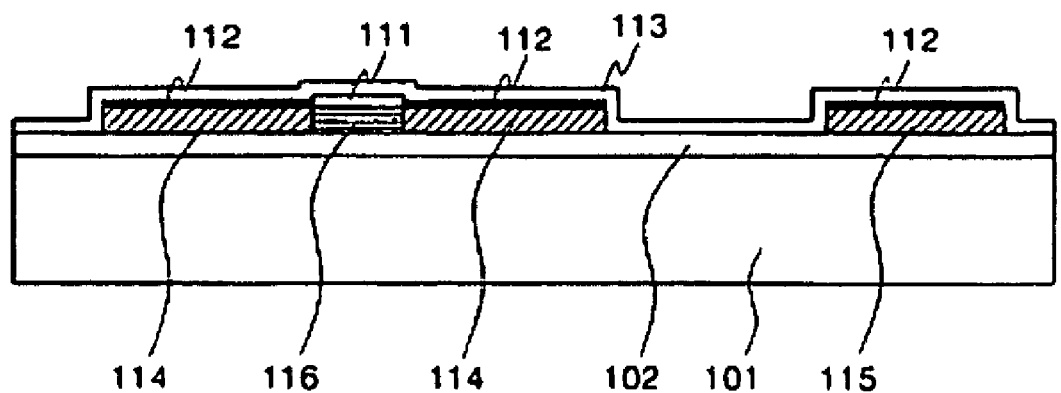

FIG. 2D is a process cross-sectional view showing a step of crystallizing source/drain regions and the first electrode of the capacitor by MIC and crystallizing the channel region by MILC by heat treating the substrate. As FIG. 2D shows, the source/drain regions 108 and the first electrode 110 of the capacitor are crystallized by MIC by forming a second insulation layer 113 on the substrate and heat treating the source/drain regions 108 and the first electrode 110 of the capacitor on the surface having the crystallization inducing material 112. Reference numerals 114 and 115 denote areas of the amorphous silicon that are crystallized with the MIC method. As already publicly known, the MIC method is carried out at a temperature of about 100 to 300° C., and it uses metal such as metal silicide, for example, nickel silicide, to crystallize amorphous silicon. The first insulation layer pattern 111 and the second insulation layer 113 are formed of a silicon oxide layer or a silicon nitride layer.

However, according to exemplary embodiments of the present invention, the MIC may be performed by heat treating at a temperature of about 400 to 700° C., preferably 500 to 600° C., and for about 1 to 18 hours, preferably 3 to 12 hours. This crystallization temperature and heat treatment time may permit crystallization of the channel region 109 of the semiconductor layer by MILC, although the crystallization temperature and heat treatment time are not required to crystallize the source/drain regions 108 and the first electrode 110 of the capacitor only. Reference numeral 116 denotes an area of the amorphous silicon that is crystallized with the MILC method.

That is, the channel region 109 is crystallized by the MILC method 116, whereby the amorphous silicon of the channel region is crystallized by laterally and continuously spreading crystallinity of the source/drain regions of semiconductor layer crystallized by the MIC method 114.

Therefore, the source/drain regions 108 of the semiconductor layer and the first electrode 110 of the capacitor formed of amorphous silicon are crystallized by the MIC method using the crystallization inducing material 112, and the channel region 109 of the semiconductor layer is crystallized by the MILC method by laterally and continuously spreading crystallinity of silicon crystallized by the MIC method.

Figure 2E:
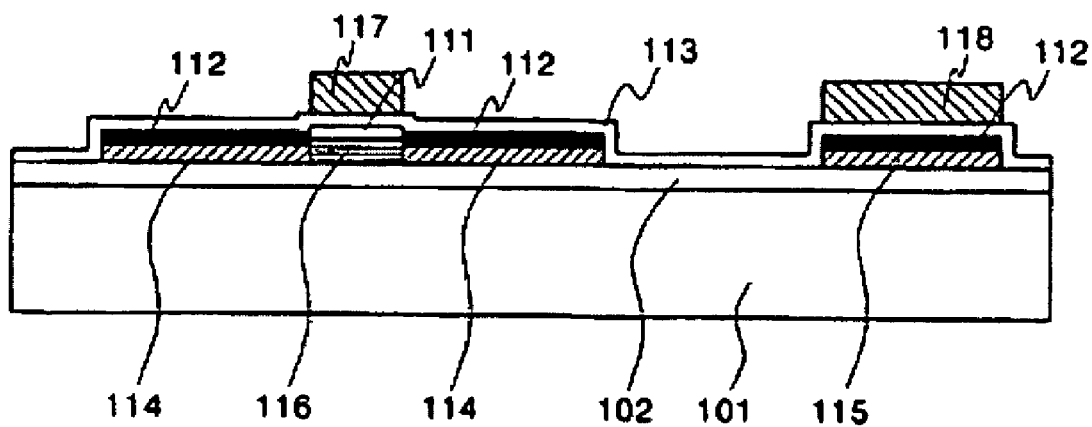

FIG. 2E is a process cross-sectional view showing a step of forming a gate electrode and a second electrode of the capacitor on the substrate. As FIG. 2E shows, a material for forming the gate electrode and the second electrode of the capacitor may be deposited on the entire surface of the substrate and then patterned, thereby simultaneously forming the gate electrode 117 and the second electrode 118. Forming the second electrode 118 completes the capacitor.

As shown in FIG. 2E, a gate insulator includes the first insulation layer pattern 111 and the second insulation layer 113, and an insulation layer of the capacitor, which is formed between the capacitor's first and second electrodes 115 and 118, is formed of the second insulation layer 113 only. Therefore, a capacitance of the capacitor can be controlled by controlling the thickness of the second insulation layer 113. Accordingly, the second insulation layer 113 may be formed thin since the thinner the second insulation layer 113 is, the more the capacitance increases.

As a result, it is possible to reduce the capacitor's surface area. More specifically, according to the reduced thickness of the capacitor's insulation layer, the capacitor's surface area may decrease by 20% to 30%, and an aperture ratio may increase by 2% to 15%. When applying a 5 transistor and 2 capacitor structure to an organic electroluminescence display device, the capacitor's surface area may decrease by 27%, and the aperture ratio may increase by 10%. Moreover, when applying a 2 transistor and 2 capacitor structure to an organic electroluminescence display device, the capacitor's surface area may decrease by 27%, and the aperture ratio may increase by 2.7%.

Alternatively, the gate insulator may also be formed with more than two layers by including other insulation layers in addition to the first insulation layer pattern 111 and the second insulation layer 113, if necessary.

Figure 2F:
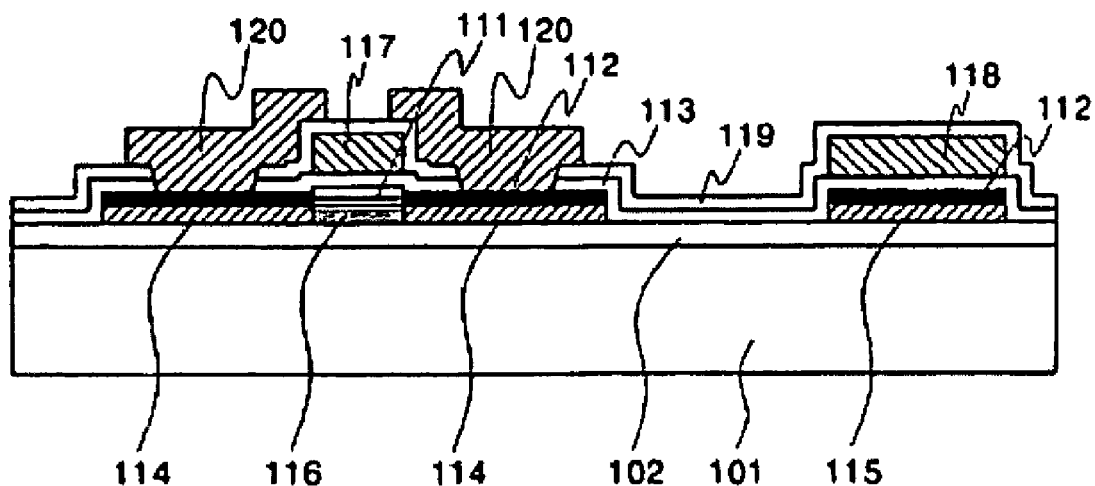

FIG. 2F is a process cross-sectional view showing a step of forming an interlayer dielectric and source/drain electrodes on the substrate. As FIG. 2F shows, an interlayer dielectric 119 may be formed over the entire surface of the substrate, regions of the interlayer dielectric 119 and the second insulation layer 113 may be etched to expose the surface of source/drain regions 108/114, and a source/drain electrode forming material may be deposited and patterned to form the source/drain electrodes 120.

FIG. 3A, FIG. 3B, FIG. 3C and FIG. 3D are cross-sectional views showing a fabrication process of a semiconductor device in which certain regions of the source/drain regions of the thin film transistor and the first electrode of the capacitor are crystallized by the MIC method, and other regions of the source/drain regions and the channel region of the thin film transistor are crystallized by the MILC method, according to an exemplary embodiment of the present invention.

Figure 3A:
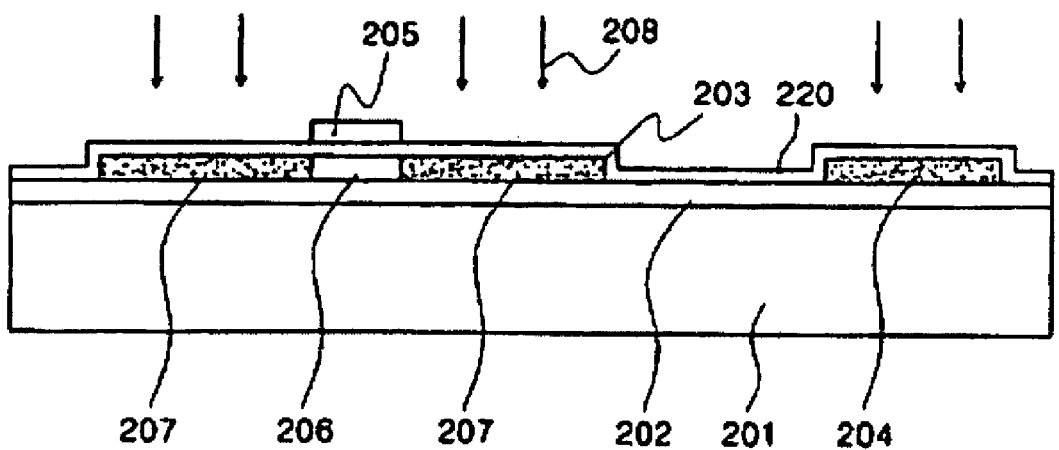
FIG. 3A, FIG. 3B, FIG. 3C and FIG. 3D are cross-sectional views showing a fabrication process of semiconductor device according to another exemplary embodiment of the present invention.

FIG. 3A is a process cross-sectional view showing a step of defining a semiconductor layer and a first electrode of a capacitor by depositing and patterning amorphous silicon on an insulating substrate, forming a first insulation layer on the substrate, forming a photoresist pattern on a certain region of the semiconductor layer, defining source/drain regions and a channel region of the semiconductor layer by implanting impurities using the photoresist pattern as a mask, and implanting impurities into the first electrode of the capacitor. As FIG. 3A shows, a buffer layer 202 may be formed on a transparent insulating substrate 201 made of material such as, for example, plastic or glass, and an amorphous silicon layer may be deposited on the buffer layer 202 by a physical vapor deposition or chemical vapor deposition method. The amorphous silicon layer may then be patterned to define a semiconductor layer 203 and a first electrode 204 of the capacitor. A first insulation layer 220 may be formed on the substrate, and a photoresist may then be coated on the substrate and exposed and developed to form a photoresist pattern 205 on a certain region of the semiconductor layer 203.

An impurity implantation process 208 may then be performed, using the photoresist pattern 205 as a mask, to implant impurities into the semiconductor layer 203 and the first electrode 204 of the capacitor, thereby forming source/drain regions 207 and a channel region 206 of the semiconductor layer and the first electrode 204 of the capacitor.

Figure 3B:
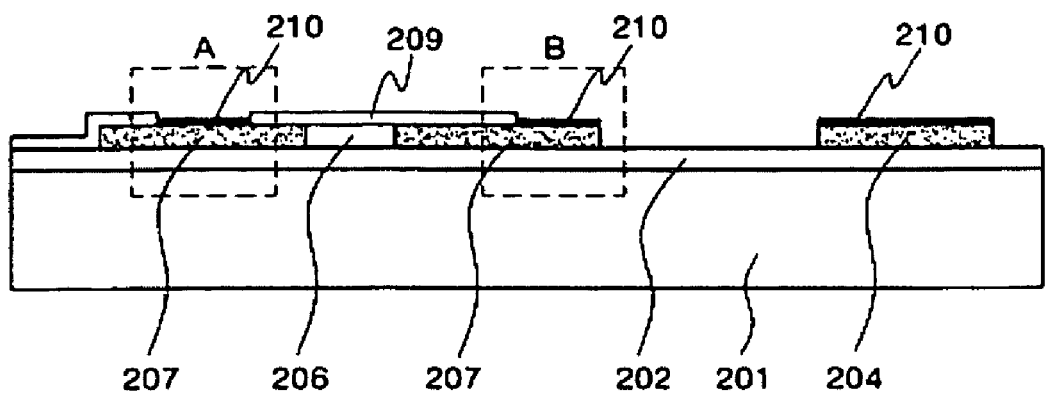

FIG. 3B is a process cross-sectional view showing a step of forming a first insulation layer pattern by etching the first insulation layer and forming a crystallization inducing material on the substrate. As FIG. 3B shows, after removing the photoresist pattern 205, another photoresist pattern (not shown) may be formed on the substrate so that the first insulation layer 220 may be patterned to form a first insulation layer pattern 209 that exposes a certain region of a central part of the source/drain regions 207, as shown in region A of FIG. 3B. Alternatively, the first insulation layer 220 may be patterned to expose a certain region of the edge of the source/drain regions 207, as shown in region B of FIG. 3B. In either case, the first insulation layer 220 is patterned to expose the first electrode 204 of the capacitor.

Next, after depositing the metal material described in FIG. 2C over the entire surface of the substrate, a crystallization inducing material 210, such as metal silicide, may be formed, and a metal material remaining after forming the crystallization inducing material 210 is removed.

The size of the certain region exposed in region A or region B is not particularly limited. The size of the certain region may equal the size of a region crystallized by the MIC method in a succeeding process to minimize the region crystallized by the MIC method, but the certain region may have a size that is similar to that of the source/drain regions. A region crystallized by the MIC method may be minimized since that region is crystallized using a crystallization inducing material, which remains on the crystallized silicon layer. The remaining crystallization inducing material may generate a leakage current in the semiconductor layer, thereby deteriorating the thin film transistor's characteristics.

Furthermore, although not shown in FIG. 3B, the crystallization inducing material 210 may be formed on a certain portion of the source/drain regions 207 adjacent to the interface between the source/drain regions 207 and the channel region 206.

Figure 3C:
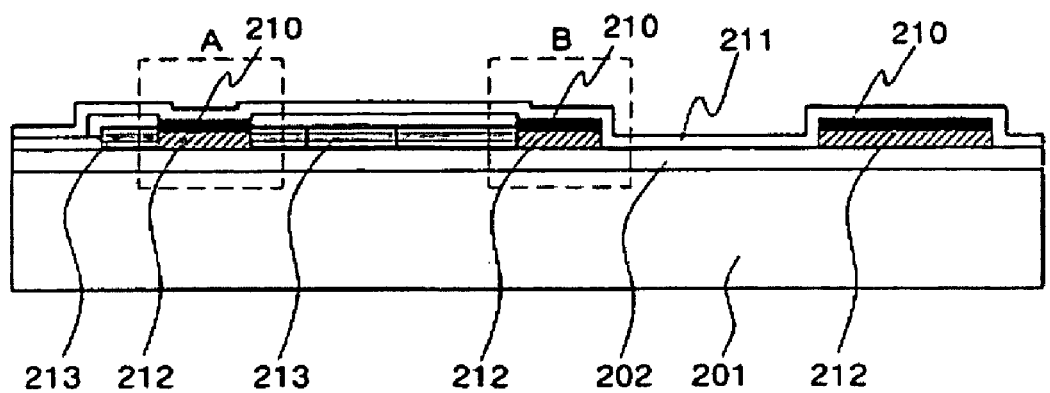

FIG. 3C is a process cross-sectional view showing a step of forming a second insulation layer on the substrate, crystallizing certain regions of the source/drain regions and the first electrode of the capacitor by the MIC method by heat treating the second insulation layer, and crystallizing the channel region and other regions of the source/drain regions by the MILC method. As FIG. 3C shows, a second insulation layer 211 may be formed over the entire surface of the substrate, and the semiconductor layer of the thin film transistor and the first electrode of the capacitor are crystallized by the MIC method or the MILC method as described in FIG. 2D.

When the crystallization inducing material 210 is formed on region A, metal induced crystallization 212 may be performed by the MIC method on the region on which the crystallization inducing material 210 is formed, and metal induced lateral crystallization 213 may be performed by the MILC method on other portions of the source/drain regions. That is, certain regions of the source/drain regions, as well as the channel region, are crystallized by spreading the MILC central around the region A of FIG. 3C so that the crystallization proceeds to the edge (left side of region A) of the source/drain region as well as to the channel region. Furthermore, when the crystallization inducing material 210 is formed on region B of FIG. 3C, the edge of the source/drain regions is crystallized by the MIC method, and other regions of the source/drain regions and the channel region are crystallized by the MILC method.

Furthermore, when the crystallization inducing material is not formed at both sides of the source/drain regions, but the crystallization inducing material is formed at one side of the source/drain regions, the MIC method may be performed at the whole one side of or certain regions of the source/drain regions only, and crystallinity may spread from silicon crystallized by the MIC method so that the channel region and the other side of the source/drain regions are crystallized by the MILC method.

The first electrode of the capacitor may be crystallized by the MIC method as in FIG. 2C and FIG. 2D.

Figure 3D:
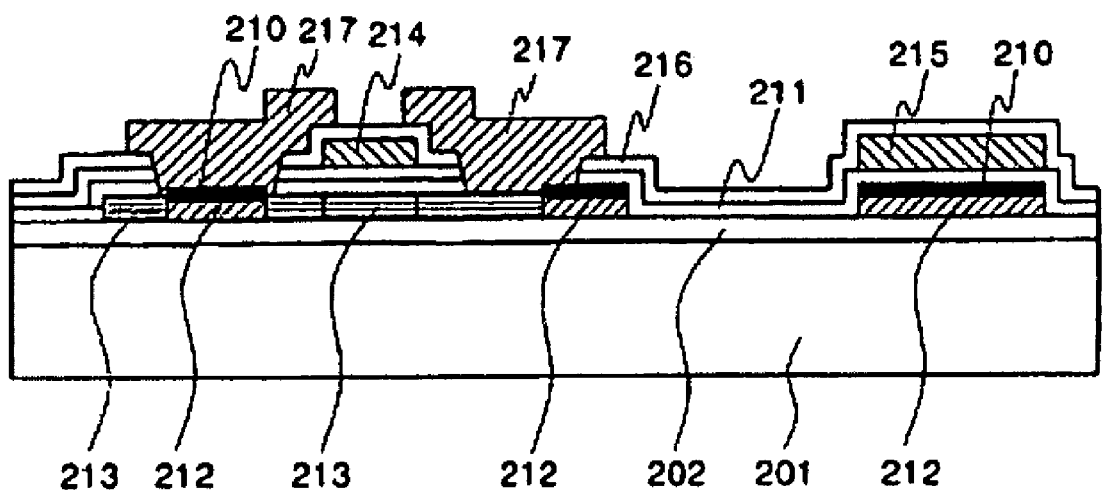

FIG. 3D is a process cross-sectional view showing a step of forming a gate electrode, a second electrode of the capacitor, an interlayer dielectric, and source/drain electrodes on the substrate. As FIG. 3D shows, a material for forming a gate electrode and a second electrode of the capacitor may be deposited over the entire surface of the substrate and then patterned to form the gate electrode 214 and the second electrode 215 of the capacitor. Next, an interlayer dielectric 216 may be deposited over the entire surface of the substrate, and then source/drain electrodes 217 may be formed as described in FIG. 2E and FIG. 2F.

Therefore, a thin film transistor may comprise a semiconductor layer having certain regions of source/drain regions crystallized by the MIC method, and other regions of the source/drain regions and the channel region crystallized by the MILC method. The thin film transistor may be formed on a transparent insulating substrate, such as plastics or glass, a gate insulator may be formed on the semiconductor layer, a gate electrode may be formed on the gate insulator, an interlayer dielectric may protect the gate electrode, and source/drain electrodes may be formed coupled with the source/drain regions of the semiconductor layer. A capacitor may comprise a first electrode crystallized by the MIC method, an insulation layer formed on the first electrode, and a second electrode formed on the insulation layer and formed of the same material as the thin film transistor's gate electrode. The capacitor is formed spaced apart from the thin film transistor.

Therefore, a semiconductor device and a method for fabricating the semiconductor device according to exemplary embodiments of the present invention may not only prevent shrinkage or warping of the substrate, but may also obtain superior characteristics for the thin film transistor's semiconductor layer and for the capacitor. The thin film transistor and the capacitor may be formed at the same time by a simple process including forming the thin film transistor's semiconductor layer and the capacitor's first electrode using amorphous silicon, crystallizing the amorphous silicon by the MIC or MILC methods, and forming the thin film transistor's gate electrode and the capacitor's second electrode using the same material so that thin film transistor and capacitor are simultaneously formed by a simple process. Further, the thin film transistor and the capacitor may be crystallized by a crystallization method that is suitable for each device, thereby performing crystallization at low temperature for a short time.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for fabricating semiconductor device, comprising:
    forming a semiconductor layer and a first electrode of a capacitor by depositing amorphous silicon on a substrate and patterning the amorphous silicon;
    forming a first insulation layer on the semiconductor layer and the first electrode of the capacitor;
    forming source/drain regions and a channel region of the semiconductor layer by implanting impurities into the semiconductor layer and implanting impurities into the first electrode of the capacitor;
    forming a first insulation layer pattern on the channel region by etching the first insulation layer;
    forming a crystallization inducing material on the semiconductor layer and the first electrode of the capacitor that are exposed by the first insulation layer pattern;
    forming a second insulation layer on the crystallization inducing material; and
    crystallizing regions of the source/drain regions and the first electrode of the capacitor by a metal induced crystallization method and crystallizing the channel region by a metal induced lateral crystallization method by heat treating the substrate.

2. The method of claim 1, wherein the crystallization inducing material is formed by depositing at least one metal selected from Ni, Pd, Ti, Ag, Au, Al, Sn, Sb, Cu, Co, Mo, Tr, Ru, Rh, Cd and Pt, heat treating the deposited metal, and removing any remaining metal.

3. The method of claim 1, wherein the crystallization inducing material is formed to thickness of 10 to 200 Å.

4. The method of claim 1, wherein the heat treating process is performed at a temperature of 400° C. to 700° C. for 1 to 18 hours.

5. The method of claim 1, wherein the heat treating process is performed at a temperature of 500° C. to 600° C. for 3 to 12 hours.

6. The method of claim 1, wherein forming the first insulation layer pattern exposes the first electrode of the capacitor and exposes either an entire region of the source/drain regions, an edge of the source/drain regions, a central part of the source/drain regions, or at least one region of the source/drain regions that is adjacent to an interface between the source/drain regions and the channel region.

7. The method of claim 1, wherein forming the second insulation layer comprises forming a gate insulator of the thin film transistor and an insulation layer of the capacitor.

8. The method of claim 1, wherein the first insulation layer pattern completely exposes the first electrode of the capacitor.

9. The method of claim 1, wherein the crystallization inducing material is formed directly on an entire upper surface of the first electrode of the capacitor.

* * * * *